United States Patent
Nagayama et al.

[11] Patent Number: 5,949,186
[45] Date of Patent: Sep. 7, 1999

[54] ORGANIC ELECTROLUMINESCENT ELEMENT

[75] Inventors: Kenichi Nagayama; Shin Kawami, both of Tsurugashima, Japan

[73] Assignee: Pioneer Electronic Corporation, Tokyo, Japan

[21] Appl. No.: 08/895,798

[22] Filed: Jul. 17, 1997

[30] Foreign Application Priority Data

Jul. 31, 1996 [JP] Japan ................................. 8-217870

[51] Int. Cl.⁶ .................................................. H05B 33/14
[52] U.S. Cl. ......................... 313/504; 313/506; 313/510
[58] Field of Search ................................. 313/504, 503, 313/500, 506, 509, 510; 315/169.3; 345/36, 76

[56] References Cited

U.S. PATENT DOCUMENTS

| | | | |
|---|---|---|---|
| 5,399,936 | 3/1995 | Namiki et al. | 313/504 |
| 5,429,884 | 7/1995 | Namiki et al. | 313/503 |
| 5,457,565 | 10/1995 | Namiki et al. | 257/40 |
| 5,684,365 | 11/1997 | Tang et al. | 315/169.3 |
| 5,731,661 | 3/1998 | So et al. | 313/504 |

*Primary Examiner*—Michael Day
*Attorney, Agent, or Firm*—Perman & Green, LLP

[57] ABSTRACT

An organic EL element includes a light-permeable anode (2), an organic emitting layer (3), a cathode (5), and a light permeable substrate(1), wherein the organic EL element emits light at a predetermined region upon application of a current between the anode (2) and the cathode (5). The element further includes an electron injection layer (4) formed between the emitting layer (3) and the cathode (5) and having a pattern corresponding to the predetermined region to be displayed. Alternatively, the element further includes an electron obstruction layer (12) formed between the emitting layer (11) and the cathode (13) and having a pattern to restrict emission corresponding to the predetermined region not to be displayed. Alternatively, the element further includes a hole injection layer (18) formed between the anode (2) and the emitting layer (19) having a pattern corresponding to the predetermined region to be displayed. Alternatively, the element further includes a hole obstruction layer (24) formed between the anode (2) and the emitting layer (19) having a pattern to restrict emission corresponding to the predetermined region not to be displayed.

4 Claims, 10 Drawing Sheets

ORGANIC ELECTROLUMINESCENT ELEMENT

BACKGROUND OF THE INVENTION

1. Field of the Invention

The present invention relates to an organic electroluminescence element using organic emitting materials.

2. Description of the Related Art

There is a conventional display panel device using an organic electroluminescence element (also referred to herein as an organic EL element) with a predetermined pattern as shown in FIG. 11B. FIGS. 11A and 11B show a main structure of the conventional organic EL element. FIG. 11A shows a schematic cross-sectional view of the organic EL element. FIG. 11B shows a plane view of an example of an anode of indium-tin oxide (ITO) with a predetermined pattern formed on the substrate of the conventional organic EL element.

As shown in FIG. 11A, the organic EL element includes a light-permeable anode (ITO) 102 formed on a substrate 101 made of light-permeable material such as glass which has the pattern as shown in FIG. 11B. In the organic EL element, an organic emitting material layer 103 and a cathode 104 are layered in turn on the anode (ITO) 102. Upon application of a predetermined voltage across the anode 102 and the cathode 104 to allow a forward current to flow through the organic emitting material layer 103, the organic emitting material layer 103 partially emits with the corresponding pattern to the portion sandwiched by the anode (ITO) 102 and the cathode 104 in which the forward current flowing in the portion of the anode (ITO) 102.

On the other hand, since the anode and the substrate are different in their material from each other. The reflectivities, transmissivities and refractive indexes are not equivalent, so that the edge profile of the anode pattern is visible through the substrate in the conventional organic EL element, even though there is non-application of voltage between both electrodes. Namely, anyone visibly recognizes the pattern to be displayed on the display panel without respect to application of voltage between both electrodes or not.

In addition, there is a display panel comprising organic EL elements each including an organic emitting material layer are arranged as minute pixels in a matrix pattern in which the pixels are partially driven in response to a necessary pattern to be displayed so that various patterns may be displayed on the panel. In such display panel, all of the pixels are visible although there is no application of voltage between both electrodes. Furthermore, even when driving the display panel, anyone recognizes the edge profiles of the pixel pattern.

To take steps against such a problem of the ITO anode, a light-permeable material with a low transmissivity may be used for the substrate so as to make a uniform mask on the pattern or pixels during the non-emission. However, such a step decreases the emission efficiency of the element and reduces a display quality of the panel.

SUMMARY OF THE INVENTION

The present invention is made in view of the forgoing problem. It is therefore an object of the invention is to provide an organic EL element with a better display quality in which any pattern does not appear even when the display panel is not driven and only the necessary pattern appear only when the display panel is driven.

The organic electroluminescent element in a first aspect of the invention comprises: a light-permeable anode, an emitting layer of organic materials and a cathode which are layered in turn on a light-permeable substrate, which emits light at a predetermined region upon application of a current between the anode and the cathode, further comprising an electron injection layer being formed between the emitting layer and the cathode and having a pattern corresponding to the predetermined region to be displayed.

Furthermore, the organic electroluminescent element in a second aspect of the invention comprises: a light-permeable anode, an emitting layer of organic materials and a cathode which are layered in turn on a light-permeable substrate, which emits light at a predetermined region upon application of a current between the anode and the cathode, further comprising an electron obstruction layer being formed between the emitting layer and the cathode and having a pattern for restricting emission and a blank pattern corresponding to the predetermined region to be displayed.

The organic electroluminescent element in a third aspect of the invention comprises: a light-permeable anode, an emitting layer of organic materials and a cathode which are layered in turn on a light-permeable substrate, which emits light at a predetermined region upon application of a current between the anode and the cathode, further comprising a hole injection layer being formed between the anode and the emitting layer to have a pattern corresponding to the predetermined region to be displayed.

Furthermore, the organic electroluminescent element in a fourth aspect of the invention comprises: a light-permeable anode, an emitting layer of organic materials and a cathode which are layered in turn on a light-permeable substrate, which emits light at a predetermined region upon application of a current between the anode and the cathode, further comprising a hole obstruction layer being formed between the anode and the emitting layer and having a pattern for restricting emission and a blank pattern corresponding to the predetermined region to be displayed.

According to the present inventions in the first aspect as above mentioned, since the electron injection layer having a pattern corresponding to the predetermined region to be displayed is formed between the emitting layer and the cathode, it results in making a distribution of the electron-injecting efficiency from the cathode to the emitting layer in accordance with the predetermined region during application of voltage between both electrodes. Therefore, the organic electroluminescent element emits light correspondingly to the pattern of the electron injection layer upon application of voltage between both electrodes, but the electron injection layer does not visibly appear in its pattern upon non-application of voltage between both electrodes.

In addition, according to the present inventions in the second aspect as above mentioned, since the electron obstruction layer having the predetermined blank pattern to be displayed is formed between the emitting layer and the cathode, it results in making a distribution of the electron-injecting efficiency from the cathode to the emitting layer in such a manner that the distribution decrease in the electron obstruction layer's predetermined pattern during application of voltage between both electrodes. Therefore, the emission of light is restricted correspondingly to the electron obstruction layer's predetermined pattern upon application of voltage between both electrodes, but the electron injection layer does not visibly appear in the electron obstruction layer's predetermined pattern upon non-application of voltage between both electrodes.

According to the present inventions in the third aspect as above mentioned, since the hole injection layer having the pattern corresponding to the predetermined region to be displayed is formed between the anode and the emitting layer, it results in making a distribution of the hole-injecting efficiency from the anode to the emitting layer in accordance with the hole injection layer's predetermined pattern during application of voltage between both electrodes. Therefore, the organic electroluminescent element emits light correspondingly to the pattern of the hole injection layer upon application of voltage between both electrodes, but the hole injection layer's predetermined pattern does not visibly appear upon non-application of voltage between both electrodes.

In addition, according to the present invention in the fourth aspect as above mentioned, since the hole obstruction layer having the predetermined blank pattern to be displayed is formed between the anode and the emitting layer, it results in making a distribution of the hole-injecting efficiency from the anode to the emitting layer in such a manner that the distribution decrease in the anode obstruction layer's predetermined pattern during application of voltage between both electrodes. Therefore, the emission of light is restricted correspondingly to in the anode obstruction layer's predetermined pattern upon application of voltage between both electrodes, but the anode injection layer does not visibly appear in the anode obstruction layer's predetermined pattern upon non-application of voltage between both electrodes.

DETAILED DESCRIPTION OF PREFERRED EMBODIMENTS

Figure 1A:
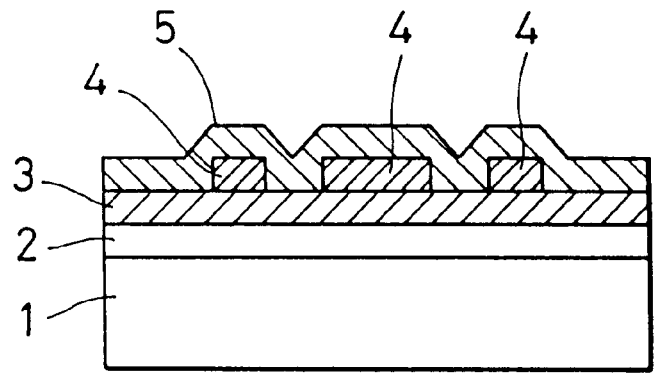
FIG. 1A is a schematic cross-sectional view showing the organic EL element of the first embodiment according to the invention.
Figure 1B:
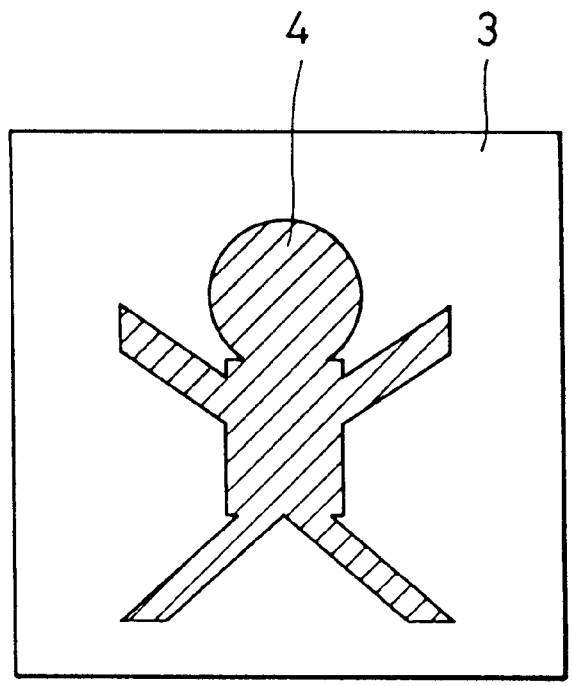
FIG. 1B is a plane view of an example of an electron injection layer with a predetermined pattern formed on the substrate of the organic EL element in the first embodiment.

Embodiments of the organic electroluminescent element according to the invention will be explained with reference to the accompanying drawings. FIGS. 1A and 1B show schematic diagrams of a main structure of an organic EL element of a first embodiment according to the invention. FIG. 1A is a schematic cross-sectional view of the organic EL element. FIG. 1B is a plane view of an example of an electron injection layer 4 with a predetermined pattern formed on an organic emitting material layer 3 of the organic EL element in the first embodiment. This organic EL element includes a first electrode (anode) 2 made of light-permeable and electrically conductive material such as indium-tin oxide (ITO) which is formed on a substrate 1 made of a light-permeable material such as glass as shown in FIG. 1A. In the organic EL element, the organic emitting material layer 3 is formed on the anode 2 in such a manner that plural organic compounds are layered in turn as a lamination.

Figure 5:
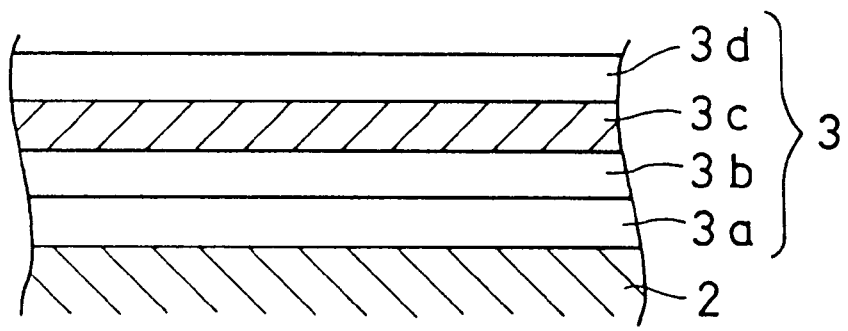
FIG. 5 is a schematic cross-sectional view showing in detail the organic emitting material layer in the organic EL element of the first embodiment according to the invention.

FIG. 5 is a schematic cross-sectional view showing in detail the lamination of the organic emitting material layer 3 shown in FIG. 1A. The organic emitting material layer 3 comprises a hole injection layer 3a, a hole transport layer 3b, an emitting layer 3c, and an electron transport layer 3d which are layered in turn on the first electrode (anode) 2. The hole injection layer 3a is made of an organic material capable of injecting holes into the hole transport layer 3b. The hole transport layer 3b is made of an organic material capable of transporting holes into the emitting layer 3c. The emitting layer 3c is made of an organic EL material such as TPD/Alq$_3$. The electron transport layer 3d is made of an organic material capable of transporting electrons into the emitting layer 3c.

In addition, as shown in FIG. 1B, an electron injection layer 4 with a predetermined pattern to be displayed is layered on the organic emitting material layer 3. The electron injection layer 4 is formed of a thin film with a high electron-injecting efficiency such as BaO, SrO, CaO at a thickness ranging from several angstroms to several tens angstroms or an alloy of Al—Li. Concretely, it is preferable that the electron injection layer 4 is an insulator having the work function of approximately 3 eV or less such as a simple substance or a mixture of oxide, carbide, boride, chloride including alkali metal, alkaline earth metal and is formed at a thickness ranging from several angstroms to several tens angstroms. A simple substance of alkali metal or alkaline earth metal or their alloy of another metal may be also used for the electron injection layer 4 preferably.

Next, a second electrode (cathode) 5 is formed on the electron injection layer 4 and the organic emitting material layer 3. The material used for the second electrode (cathode) 5 is a substance with an electron-injecting efficiency lower than that of the electron injection layer 4, for example, Al or the like.

When the organic EL element of the first embodiment according to the invention above mentioned is driven in such a manner that the predetermined voltage is applied across the first electrode (anode) 2 and the second electrode (cathode) 5, the organic emitting material. layer 3 partially emits light at the pattern of the electron injection layer 4, because electrons are efficiently injected to the organic emitting material layer 3 through the electron injection layer 4. On the other hand, emission hardly appears at portions other than the electron injection layer 4 is formed, because electrons are hardly injected to the organic emitting material layer 3. As a result, the organic emitting material layer 3 clearly provides the light-emission corresponding to the pattern of the electron injection layer 4.

In addition, the electron injection layer 4 is very thin and have a metal-like glossy similar to the second electrode (cathode) 5. Therefore, when this organic EL element is not driven, the pattern of the electron injection layer 4 is not visibly recognized in comparison with the second electrode (cathode) 5. The appearance of the element may be a mirror comprising the electron injection layer 4 and the second electrode (cathode) 5 through the substrate 1, the first electrode (anode) 2 and the organic emitting material layer 3.

Figure 2:
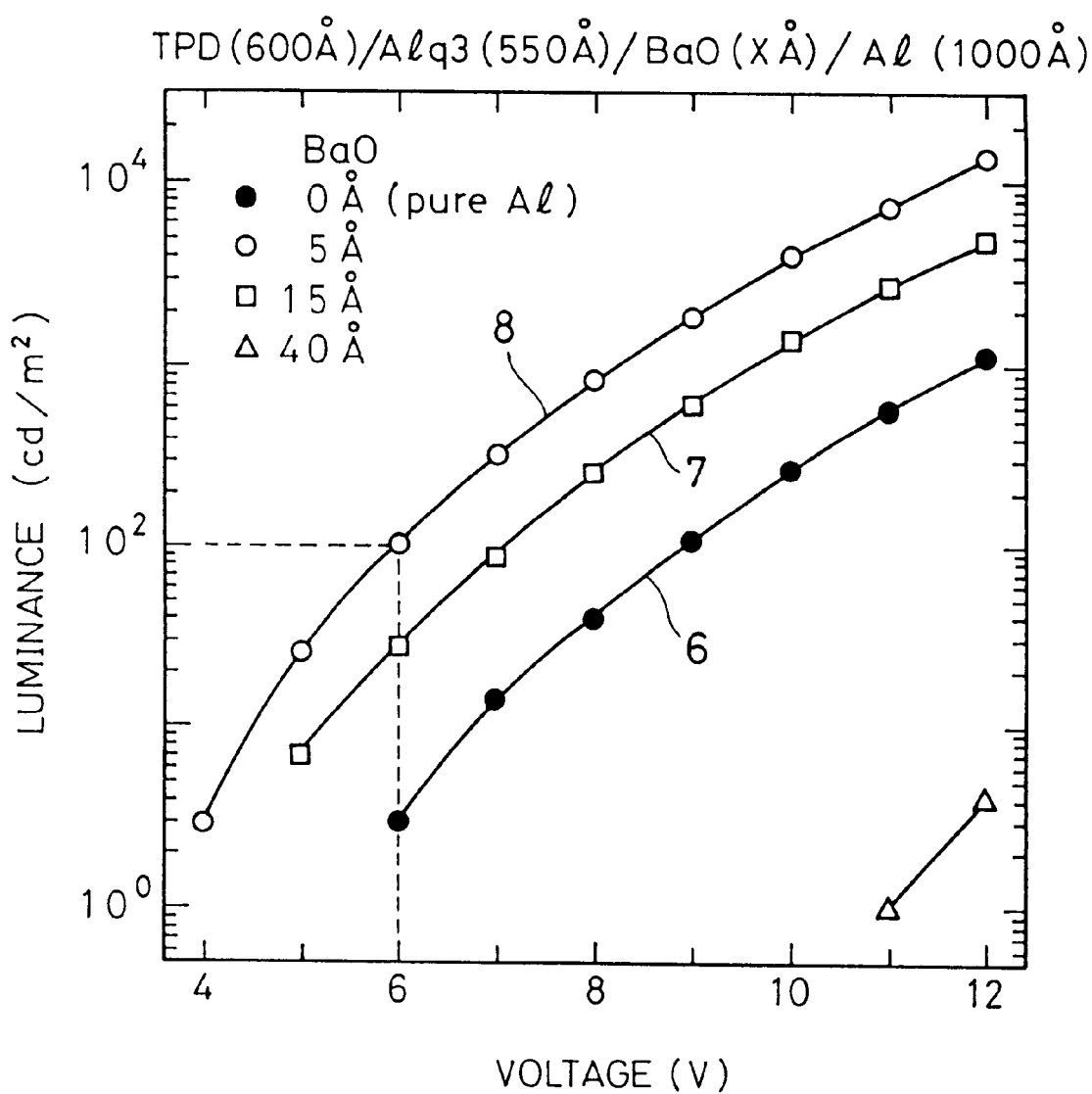
FIG. 2 is a graph showing the voltage-luminance property of the organic EL element of the first embodiment according to the invention.

FIG. 2 shows a voltage-luminance property of the organic EL element of the first embodiment in which BaO is used for the electron injection layer. In FIG. 2, reference numeral 6 denotes a characteristic curve of the element in which the thickness of the BaO electron injection layer is 0, zero i.e., no electron injection layer is formed. Reference numeral 7 denotes a characteristic curve of the element in which the thickness of the BaO electron injection layer is 15 angstroms. Reference numeral 8 denotes a characteristic curve of the element in which the thickness of the BaO electron injection layer is 5 angstroms.

As seen from FIG. 2, the luminance of the element having the BaO electron injection layer whose thickness is 0, i.e., no electron injection layer is formed, is 3 cd/m$^2$ under the condition that the applied voltage is 6V. In contrast, the luminance of the element with the BaO electron injection layer's thickness 5 angstroms is 110 cd/m$^2$. The luminance of the element with the BaO thickness of 15 angstroms is 30 cd/m$^2$. The luminance of the element with the BaO thickness of 40 angstroms is nearly 0 cd/m$^2$.

Therefore, when the BaO electron injection layer have a thickness of approximately 20 angstroms or less, the contrast ratio caused by the existence of the electron injection layer (BaO) to non-existence thereof is 10 to 1 or more in the EL element. As a result, the organic EL element of the first embodiment according to the invention may be formed under the condition that the BaO electron injection layer have a thickness of approximately 20 angstroms or less.

Figure 3A:
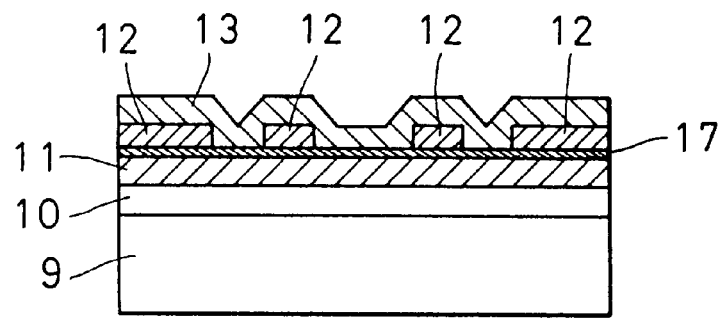
FIG. 3A is a schematic cross-sectional view showing the organic EL element of the second embodiment according to the invention.
Figure 3B:
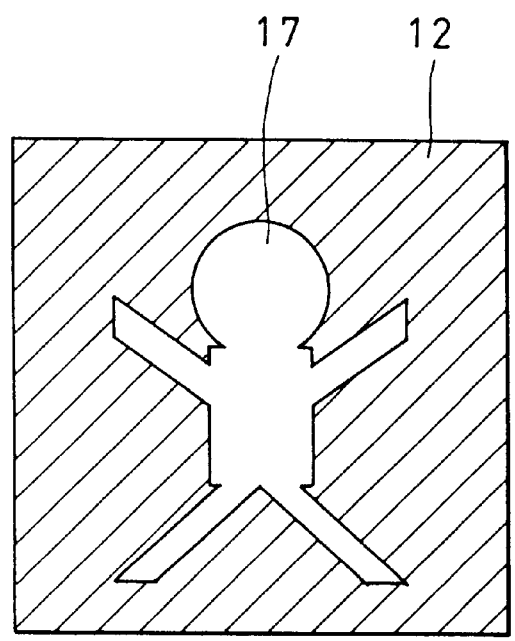
FIG. 3B is a plane view of an example of an anode with a predetermined pattern formed on the substrate of the organic EL element in the second embodiment.

Next, a second embodiment according to the invention will be explained with reference to the accompanying drawings. FIGS. 3A and 3B show schematic diagrams of a main structure of an organic EL element of the second embodiment according to the invention. FIG. 3A is a schematic cross-sectional view of the organic EL element. FIG. 3B is a plane view of an example of an electron obstruction layer 12 with a predetermined blank pattern formed on the organic emitting material layer of the organic EL element in the second embodiment. This organic EL element includes a first electrode (anode) 10 made of light-permeable material such as ITO which is formed on a substrate 9 made of light-permeable material such as glass as shown in FIG. 3A. In the organic EL element, the organic emitting material layer 11 is formed on the anode 10 in such a manner that plural organic compounds such as TPD/Alq3 etc. are layered in turn as a lamination.

Figure 6:
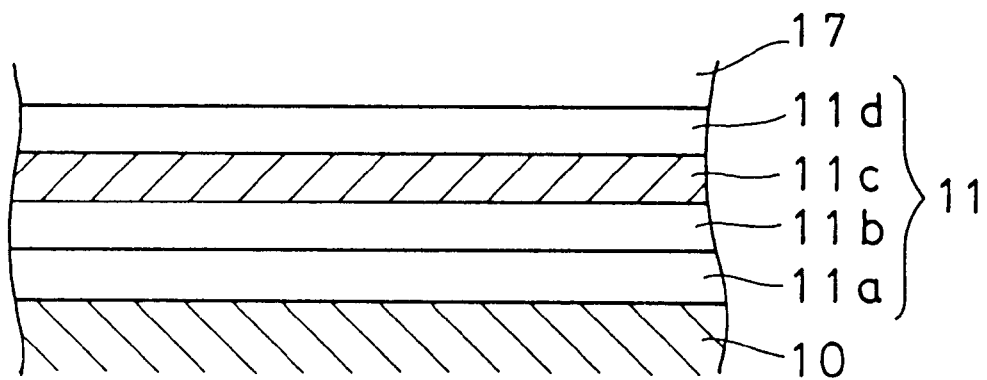
FIG. 6 is a schematic cross-sectional view showing in detail the organic emitting material layer in the organic EL element of the second embodiment according to the invention.

FIG. 6 is a schematic cross-sectional view showing in detail the lamination of the organic emitting material layer 11 shown in FIG. 3A. The organic emitting material layer 11 comprises a hole injection layer 11a, a hole transport layer 11b, an emitting layer 11c, and an electron transport layer 11d which are layered in turn on the first electrode (anode) 10. The hole injection layer 11a is made of an organic material capable of injecting holes into the hole transport layer 11b. The hole transport layer 11b is made of an organic material capable of transporting holes into the emitting layer 11c. The emitting layer 11c is made of an organic EL material such as TPD/Alq3. The electron transport layer 11d is made of an organic material capable of transporting electrons into the emitting layer 11c.

In addition, an electron injection layer 17 is entirely layered on the organic emitting material layer 11 as a whole.

Furthermore, as shown in FIG. 3B, an electron obstruction layer 12 is layered on the electron injection layer 17 in such a manner that a predetermined pattern to be displayed is formed as a blank pattern in the electron obstruction layer 12. The electron obstruction layer 12 is formed of a thin film such as SiO$_2$ with several tens angstroms thickness, a material preventing the electron-injection such as Al, or a low electron-injecting efficiency such as oxide, boride, chloride.

In addition, a material with a relatively low work function of approximately 3 eV or less may be preferably used for the electron obstruction layer 12. In this case, the electron obstruction layer 12 is formed at a thickness ranging from 40 to 100 angstroms. Furthermore, when the other material is used for the electron obstruction layer 12 such as MgO (the work function of approximately 3.6 eV), TiO$_2$ (the work function of approximately 3.9 eV), SiC (the work function of approximately 4.5 eV), VC (the work function of approximately 3.9 eV) or NbC (the work function of approximately 4.1 eV), the electron obstruction layer 12 may be formed at a thickness ranging from 10 to 100 angstroms.

Next, a second electrode (cathode) 13 is formed on the electron injection layer 17 and the electron obstruction layer 12. The material used for the second electrode (cathode) 13 is a substance with a high electron-injecting efficiency, for example, an alloy of Al—Li, a lamination of BaO/Al layers or the like.

When the organic EL element of the second embodiment according to the invention above mentioned is driven in such a manner that the predetermined voltage is applied across the first electrode (anode) 10 and the second electrode (cathode) 13, emission hardly appears at the portion covered with the electron obstruction layer 12, because electrons are hardly injected to the organic emitting material layer 11 at the covered portion. On the other hand, the emitting layer 11c of the organic emitting material layer 11 partially emits light at the blank pattern of the electron obstruction layer 12, because electrons are efficiently injected to the organic emitting material layer 11c. As a result, the organic emitting material layer 11 clearly provides the light-emission corresponding to the blank pattern of the electron obstruction layer 12.

In addition, the electron obstruction layer 12 is very thin and have a metal-like glossy similar to the second electrode (cathode) 13. Therefore, when this organic EL element is not driven, the pattern of the electron obstruction layer 12 is not visibly recognized in comparison with the second electrode (cathode) 13. The appearance of the element may be a mirror comprising the electron obstruction layer 12 and the second electrode (cathode) 13 through the substrate 9, the first electrode (anode) 10 and the organic emitting material layer 11.

Figure 4:
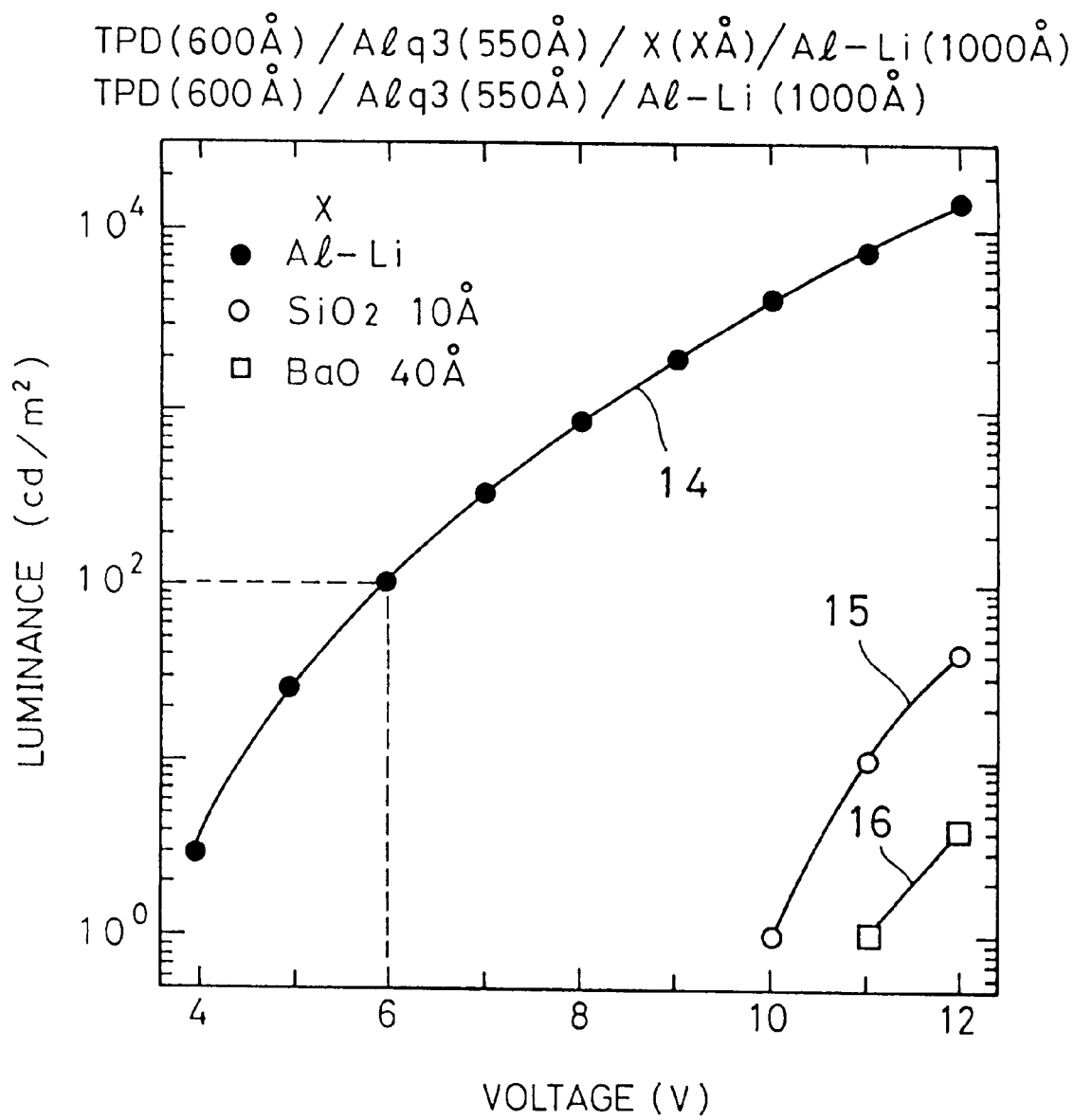
FIG. 4 is a graph showing the voltage-luminance property of the organic EL element of the second embodiment according to the invention.

FIG. 4 shows voltage-luminance properties of the organic EL elements in the second embodiment in which $SiO_2$ and BaO are used for the electron obstruction layers respectively. In FIG. 4, reference numeral 14 denotes a characteristic curve of the element in which the thickness of the electron obstruction layer is 0, zero i.e., no the electron obstruction layer is formed. Reference numeral 15 denotes a characteristic curve of the element in which the thickness of the electron obstruction layer 12 made of $SiO_2$ is 10 angstroms. Reference numeral 16 denotes a characteristic curve of the element in which the thickness of the electron obstruction layer 12 made of BaO is 40 angstroms.

As seen from FIG. 4, the luminance of the element having the electron obstruction layer whose thickness is 0, i.e., no electron obstruction layer is formed, is 100 $cd/m^2$ under the condition that the applied voltage is 6v. In contrast, the luminance of the element with the electron obstruction layer 12 of $SiO_2$ or BaO is nearly 0 $cd/m^2$.

In the above mentioned embodiments according to the invention, if the organic EL element emits light residually under the condition of non-application of voltage across both the electrodes, then such a residual emission of the organic EL element may be prevented by applying the reverse bias voltage to both the electrodes. Therefore, the organic EL element according to the invention achieves a unique function capable of appearing as a mirror during its non-emission state or presenting a lighting pattern on the mirror during its emission state.

As mentioned above, the second embodiment is formed in such a manner that the hole injection layer 11a, the hole transport layer 11b of the organic material, the emitting layer 11c of the organic material, the electron transport layer 11d of the organic material are layered in turn on the first electrode (anode) 10, and after that the electron injection layer 17 is entirely layered on the organic emitting material layer 11, and then the electron obstruction layer 12 with the predetermined blank pattern to be displayed is formed on the electron injection layer 17. In addition to the second embodiment, the electron obstruction layer 12 may be formed in any interface between the emitting layer 11c and the second electrode (cathode) 13. Namely, the electron obstruction layer 12 may be layered between the emitting layer 11c and the electron transport layer 11d or between the electron transport layer 11d and the electron injection layer 17 for achieving the advantageous effect similarly to the above embodiments. Furthermore, the combination of interpositions of the electron obstruction layers may be used together to form a desired lighting pattern on the element.

In addition, the first and second embodiments may be also used together to form a desired lighting pattern on the element.

In the first and second embodiments mentioned above, the pattern to be displayed lightningly is formed in the electron injection layer or the electron obstruction layer in such a manner the distribution of the electron-injecting efficiency with respect to electrons injected from the second electrode (cathode) is controlled in accordance with the pattern thereof. In addition to these embodiments, there are a third embodiment shown in FIG. 7 and a fourth embodiment shown in FIG. 9. Instead of the patterned electron injection layer or electron obstruction layer, the pattern to be displayed lightningly may be formed in the hole injection layer 18 or the hole obstruction layer 24 in such a manner the distribution of the hole-injecting efficiency with respect to holes injected from the first electrode (anode) is controlled in accordance with the pattern thereof.

Figure 7A:
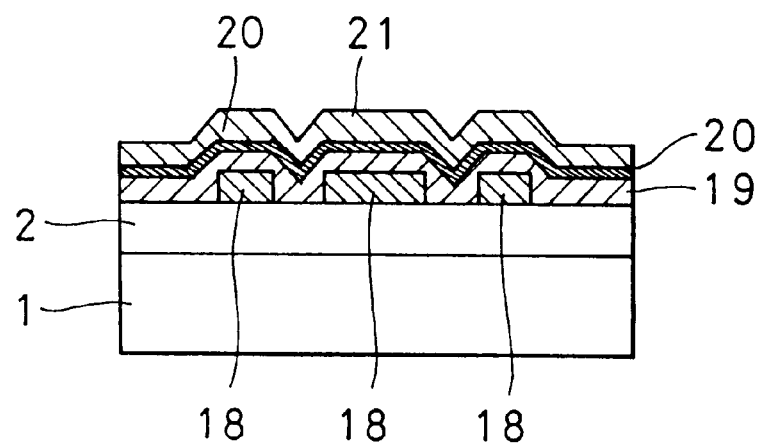
FIG. 7A is a schematic cross-sectional view showing the organic EL element of the third embodiment according to the invention.
Figure 7B:
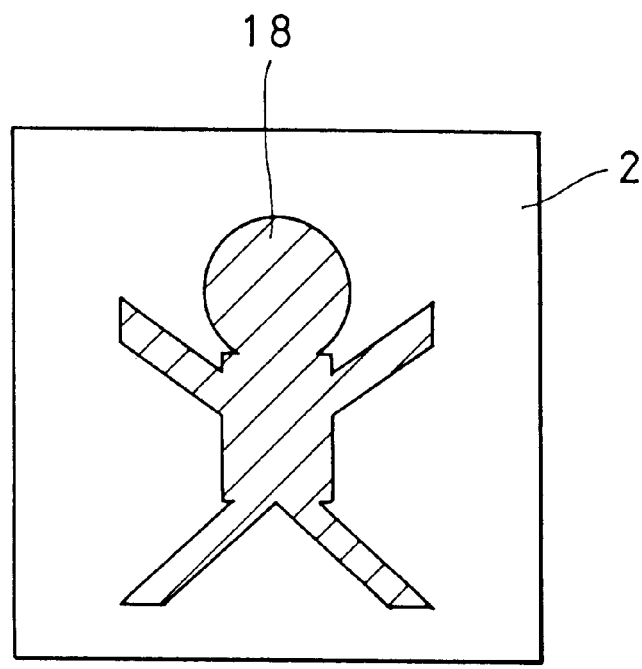
FIG. 7B is a plane view of an example of an anode with a predetermined pattern formed on the substrate of the organic EL element in the third embodiment.

FIGS. 7A and 7B show schematic diagrams of a main structure of an organic EL element of the third embodiment according to the invention. FIG. 7A is a schematic cross-sectional view of the organic EL element. FIG. 7B is a plane view of an example of a hole injection layer 18 with a predetermined pattern formed on a first electrode (anode) of the organic EL element in the third embodiment. This organic EL element includes a first electrode (anode) 2 made of light-permeable material such as ITO which is formed on a substrate 1 made of a light-permeable material such as glass as shown in FIG. 7A. Next, a hole injection layer 18 with a predetermined pattern to be displayed is layered on the first electrode (anode) 2 as shown in FIG. 7B. In the organic EL element, an organic emitting material layer 19 is formed on the hole injection layer 18 and the first electrode (anode) 2 in such a manner that plural organic compounds are layered in turn as a lamination. The organic material layer 19 comprises a hole transport layer 3b of the organic material, an emitting layer 3c of the organic material, and an electron transport layer 3d of the organic material which are entirely layered in turn on the layers 18 and 2. Next, an electron injection layer 20 and the second electrode (cathode) 21 are also entirely layered in turn thereon. In addition, the materials used for the electron injection layer 20 and the second electrode (cathode) 21 are the same as those of the electron injection layer 4 and the second electrode (cathode) 13 respectively.

As a result, the portion of the emitting layer 3c in the organic material layer 19 corresponding to the hole injection layer 18 will receive holes due to a high hole-injecting efficiency of the hole injection layer during driven, so that the desired pattern is lightened.

Thus, the hole injection layer 18 is formed of a thin film of material with a high hole-injecting efficiency such as Pt, CuO or the like at a thickness ranging from several angstroms to several tens angstroms.

Figure 8:
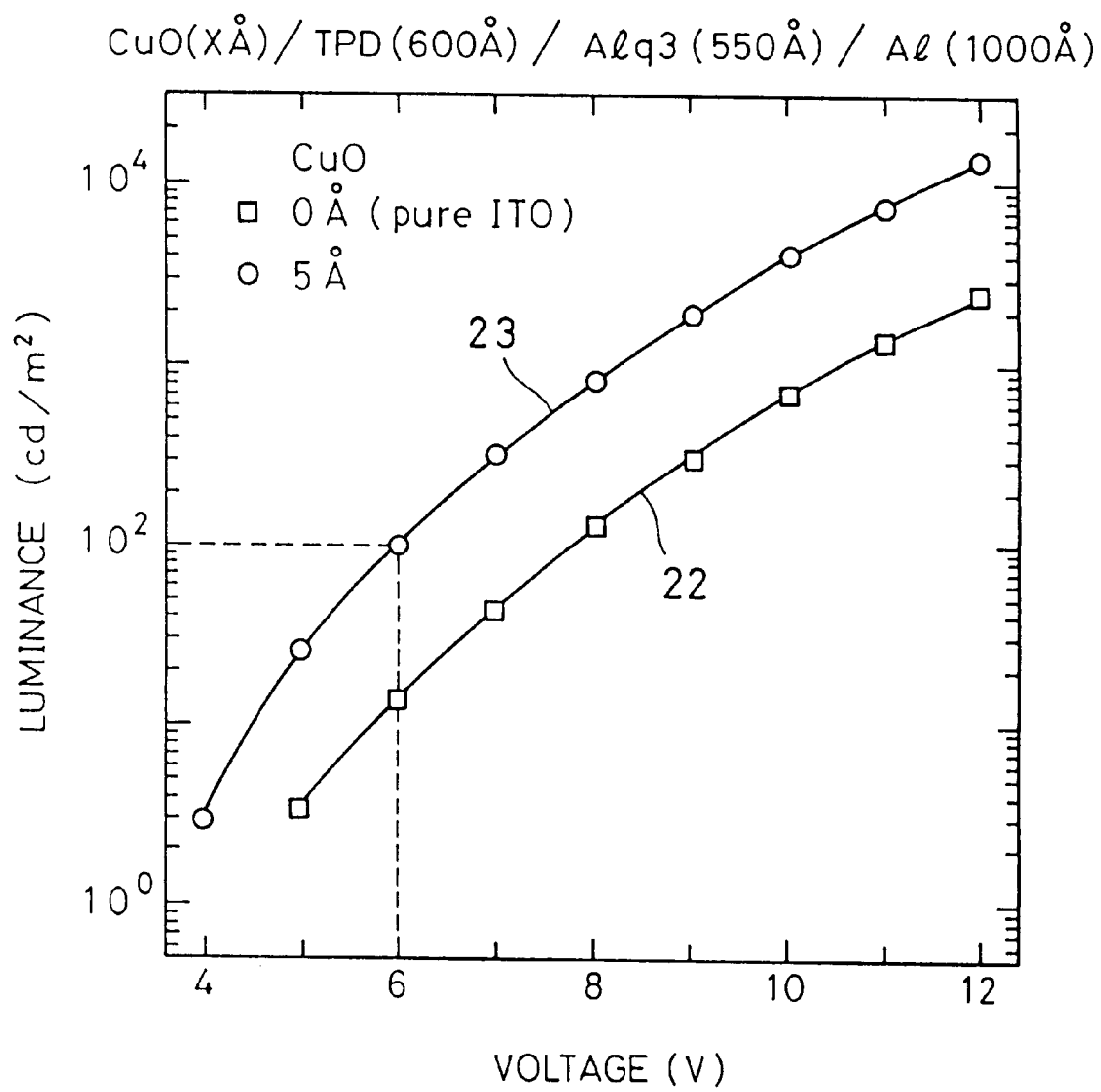
FIG. 8 is a graph showing the voltage-luminance property of the organic EL element of the third embodiment according to the invention.

FIG. 8 shows a voltage-luminance property of the organic EL element of the third embodiment in which CuO is used for the hole injection layer. In FIG. 8, reference numeral 22 denotes a characteristic curve of the element in which the thickness of the CuO hole injection layer is 0, zero i.e., no hole injection layer is formed. Reference numeral 23 denotes a characteristic curve of the element in which the thickness of the CuO hole injection layer is 5 angstroms.

As seen from FIG. 8, the luminance of the element having the CuO hole injection layer whose thickness is 0, i.e., no hole injection layer is formed, is 13 $cd/m^2$ under the condition that the applied voltage is 6V. In contrast, the luminance of the element with the CuO hole injection layer's thickness 5 angstroms is 110 $cd/M^2$. Since the contrast ratio caused by the existence of the CuO hole injection layer to non-existence thereof is 8 to 1 or more in the EL element. As a result, the organic EL element of the third embodiment is sufficient to display the pattern lightened correspondingly to the pattern of the hole injection layer.

In addition, the hole injection layer 18 is very thin and have a metal-like glossy similar to the second electrode (cathode) 21. Therefore, when this organic EL element is not driven in non-emission, the pattern of the hole injection layer 18 is not visibly recognized in comparison with the second electrode (cathode) 21. The appearance of the element may be recognized as a mirror comprising the hole injection layer 18 and the second electrode (cathode) 21 through the substrate 1, the first electrode (anode) 2, the organic material layer 19 and the electron injection layer 20.

Figure 9A:
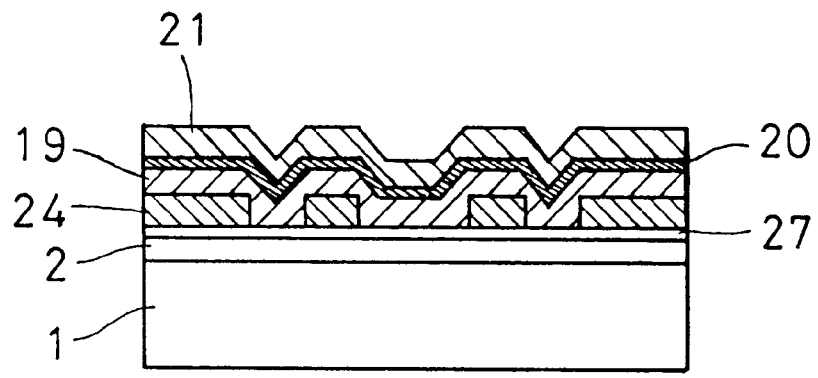
FIG. 9A is a schematic cross-sectional view showing the organic EL element of the third embodiment according to the invention.
Figure 9B:
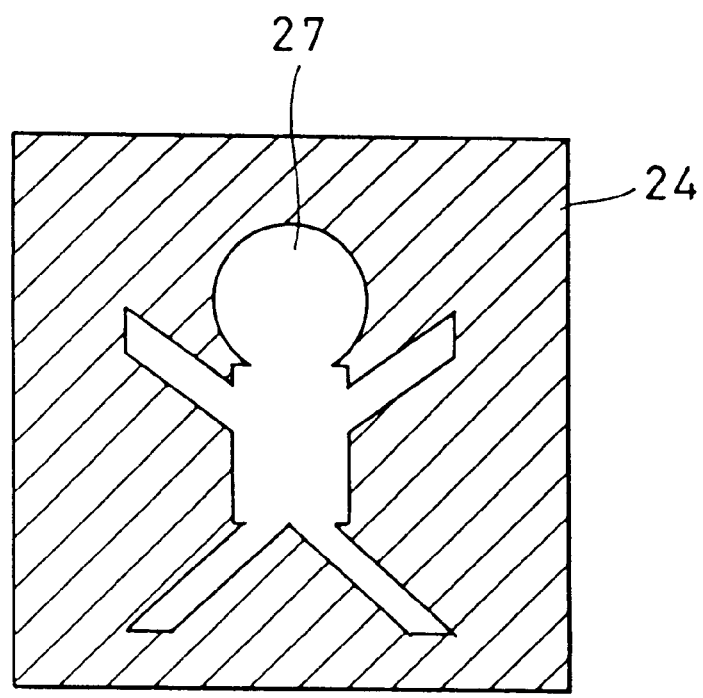
FIG. 9B is a plane view of an example of an anode with a predetermined pattern formed on the substrate of the organic EL element in the fourth embodiment.

Furthermore, FIGS. 9A and 9B show schematic diagrams of a main structure of an organic EL element of a fourth embodiment according to the invention. FIG. 9A is a schematic cross-sectional view of the organic EL element. FIG. 9B is a plane view of an example of a hole obstruction layer 24 with a predetermined blank pattern formed on a hole injection layer 27 layer of the organic EL element in the fourth embodiment. This organic EL element includes a first electrode (anode) 2 made of light-permeable material such as ITO which is formed on a substrate 1 made of light-permeable material such as glass as shown in FIG. 9A. Next, the hole injection layer 27 is entirely layered on the first electrode (anode) 2 as a whole. Thus, the hole obstruction layer 24 with the predetermined blank pattern is formed on the hole injection layer 27 layer. In the organic EL element, an organic emitting material layer 19 is formed on the hole injection layer 27 and the hole obstruction layer 24 in such a manner that plural organic compounds are layered in turn as a lamination. The organic material layer 19 comprises a hole transport layer 3b of the organic material, an emitting layer 3c of the organic material, and an electron transport layer 3d of the organic material which are entirely layered in turn on the layers 27 and 24. Next, an electron injection layer 20 and the second electrode (cathode) 21 are also entirely layered in turn thereon.

In addition, the hole injection layer 27 is formed of a thin film of material with a high hole-injecting efficiency such as Pt, CuO or the like at a thickness ranging from several angstroms to several tens angstroms in a similar manner to the hole injection layer 18 above mentioned.

Furthermore, the hole obstruction layer 24 is formed of a thin film such as $SiO_2$ a thickness ranging from several angstroms to several tens angstroms, a material preventing the hole-injection such as Li, BaO, CaO, SrO, or a material with a low hole-injecting efficiency.

Figure 10:
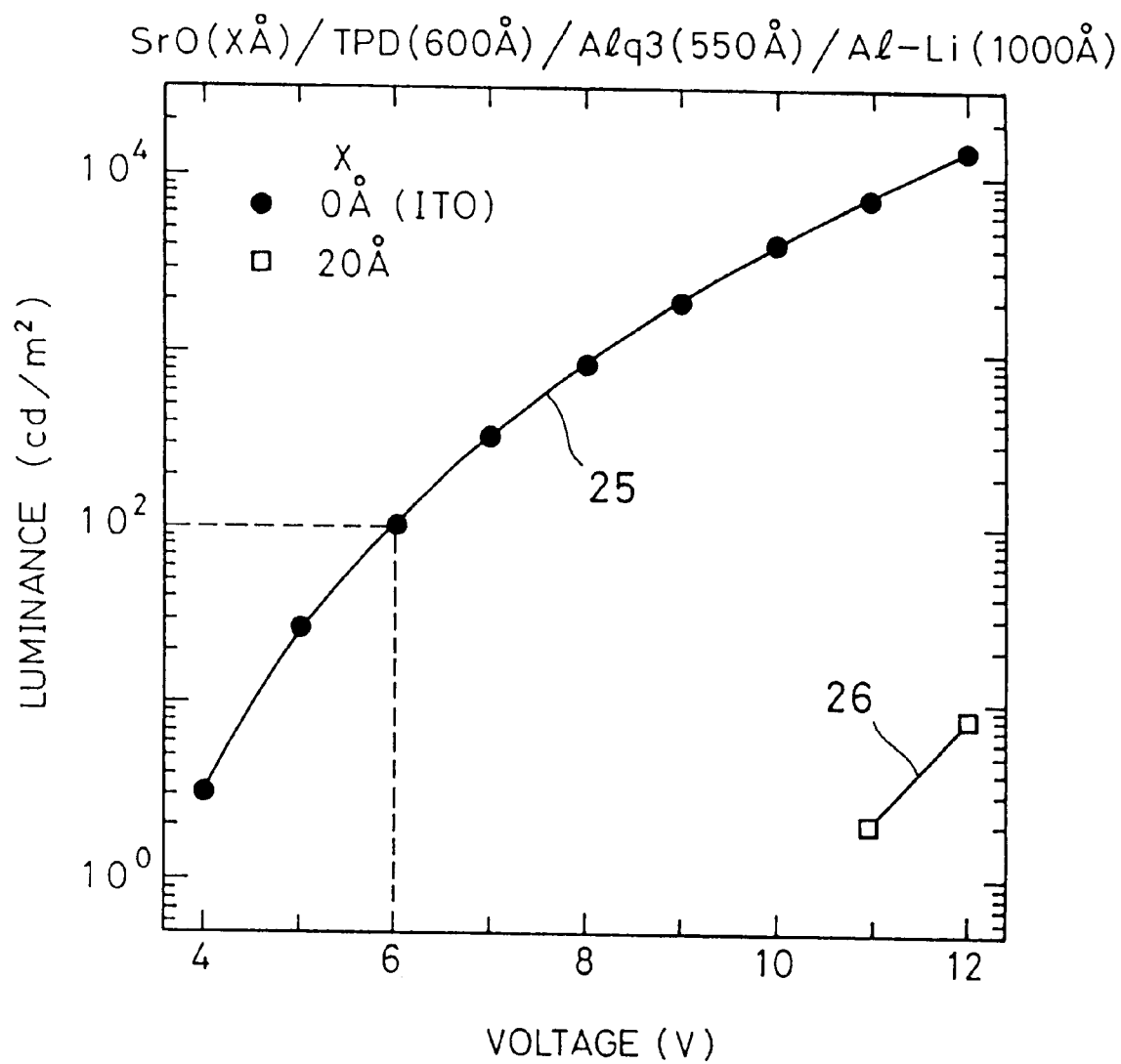
FIG. 10 is a graph showing the voltage-luminance property of the organic EL element of the fourth embodiment according to the invention.
Figure 11A:
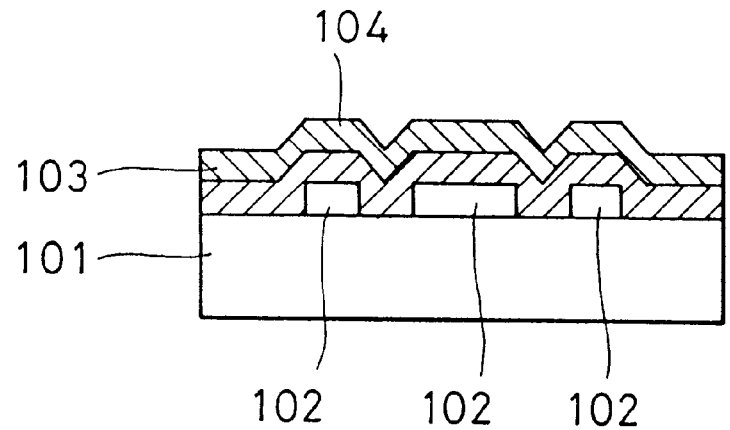
FIG. 11A is a schematic cross-sectional view showing a conventional organic EL element of the first embodiment according to the invention.
Figure 11B:
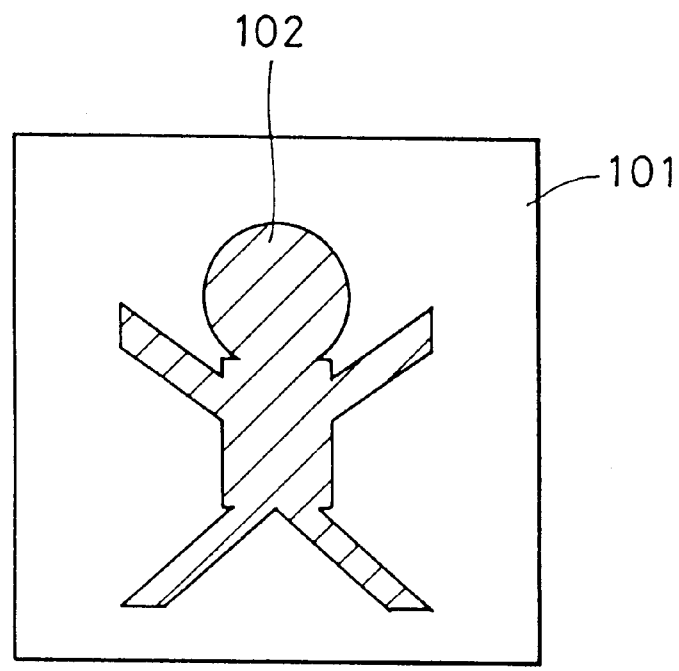
FIG. 11B is a plane view of an anode of the conventional organic EL element.

FIG. 10 shows a voltage-luminance property of the organic EL elements in the fourth embodiment in which SrO is used for the hole obstruction layer. In FIG. 10, reference numeral 25 denotes a characteristic curve of the element in which the thickness of the hole obstruction layer is 0, zero i.e., no hole obstruction layer is formed. Reference numeral 26 denotes a characteristic curve of the element in which the thickness of the hole obstruction layer 24 made of SrO is 20 angstroms.

As seen from FIG. 10, the luminance of the element having the hole obstruction layer whose thickness is 0, i.e., no hole obstruction layer is formed, is 110 $cd/m^2$ under the condition that the applied voltage is 6v. In contrast, the luminance of the element with the hole obstruction layer 12 of SrO with the 20 angstroms thickness is 1 $cd/m^2$ or less. Since the contrast ratio caused by the existence of the Sro hole obstruction layer to non-existence thereof is 100 to 1 or more in the EL element. As a result, the organic EL element of the fourth embodiment is sufficient to display the pattern lightened correspondingly to the blank pattern of the hole obstruction layer.

When the organic EL element of the fourth embodiment is driven in such a manner that the predetermined voltage is applied across the first electrode (anode) 2 and the second electrode (cathode) 21, emission hardly appears at the portion covered with the hole obstruction layer 24, because holes are hardly injected to the organic emitting material layer 19 at the covered portion. On the other hand, the emitting layer 3c of the organic emitting material layer 19 partially emits light at the blank pattern of the hole obstruction layer 24, because holes are efficiently injected to the organic emitting material layer 3c. As a result, the organic emitting material layer 19 clearly provides the light-emission corresponding to the blank pattern of the hole obstruction layer 24.

In addition, the hole obstruction layer 24 is very thin and have a metal-like glossy similar to the second electrode (cathode) 21. Therefore, when this organic EL element is not driven, the pattern of the hole obstruction layer 24 is not visibly recognized in comparison with the second electrode (cathode) 21. The appearance of the element may be a mirror comprising the hole obstruction layer 24 and the second electrode (cathode) 21 through the substrate 1, the first electrode (anode) 2, the organic material layer 19 and the electron injection layer 20.

Although the hole obstruction layer 24 with the predetermined blank pattern to be displayed is formed between the hole injection layer 27 and the hole transport layer 3b in the fourth embodiment, the hole obstruction layer 24 may be formed in any interface between the emitting layer 3c and the first electrode (anode) 2. Namely, the electron obstruction layer 12 may be layered between the emitting layer 3c and the hole transport layer 3b or between the hole injection layer 27 and the first electrode (anode) 2 for achieving the advantageous effect similarly to the above embodiments. Furthermore, the combination of interpositions of the hole obstruction layers may be used together to form a desired lighting pattern on the element.

As mentioned above, according to the present inventions in the first aspect, since the electron injection layer having the predetermined pattern to be displayed is formed between the emitting layer and the cathode, it results in making a distribution of the electron-injecting efficiency from the cathode to the emitting layer in accordance with the predetermined pattern during application of voltage between both electrodes. Therefore, the organic electroluminescent element emits light correspondingly to the pattern of the electron injection layer upon application of voltage between both electrodes, but upon non-application of voltage between both electrodes, the electron injection layer does not visibly appear in its pattern so that the interface of the cathode may be visibly recognized uniformly through the substrate, the anode, the organic material layer, and the electron injection layer. As a result, the organic EL element achieves a better display quality in which any pattern does not appear even when the display panel is not driven and only the necessary pattern appear only when the display panel is driven.

In addition, according to the present inventions in the second aspect, since the electron obstruction layer having the predetermined blank pattern to be displayed is formed between the emitting layer and the cathode, it results in making a distribution of the electron-injecting efficiency from the cathode to the emitting layer in such a manner that the distribution decrease in the electron obstruction layer's predetermined pattern during application of voltage between both electrodes., Therefore, the emission of light is restricted correspondingly to the electron obstruction layer's predetermined pattern upon application of voltage between both electrodes, but the electron injection layer does not visibly appear in the electron obstruction layer's predetermined pattern upon non-application of voltage between both electrodes so that the interface of the cathode may be visibly recognized uniformly through the substrate, the anode, the organic material layer, and the electron obstruction layer. As a result, the organic EL element achieves a better display quality in which any pattern does not appear even when the display panel is not driven and only the necessary pattern appear only when the display panel is driven.

According to the present inventions in the third aspect, since the hole injection layer having the pattern corresponding to the predetermined region to be displayed is formed between the anode and the emitting layer, it results in making a distribution of the hole-injecting efficiency from the anode to the emitting layer in accordance with the hole injection layer's predetermined pattern during application of voltage between both electrodes. Therefore, the organic electroluminescent element emits light correspondingly to the pattern of the hole injection layer upon application of voltage between both electrodes, but the hole injection layer's predetermined pattern does not visibly appear upon non-application of voltage between both electrodes so that the interface of the cathode may be visibly recognized uniformly through the substrate, the anode, the hole injection layer, the organic material layer, and the electron obstruction layer. As a result, the organic EL element achieves a better display quality in which any pattern does not appear even when the display panel is not driven and only the necessary pattern appear only when the display panel is driven.

In addition, according to the present invention in the fourth aspect, since the hole obstruction layer having the predetermined blank pattern to be displayed is formed between the anode and the emitting layer, it results in making a distribution of the hole-injecting efficiency from the anode to the emitting layer in such a manner that the distribution decrease in the anode obstruction layer's predetermined pattern during application of voltage between both electrodes. Therefore, the emission of light is restricted correspondingly to in the anode obstruction layer's predetermined pattern upon application of voltage between both electrodes, but the anode injection layer does not visibly appear in the anode obstruction layer's predetermined pattern upon non-application of voltage between both electrodes so that the interface of the cathode may be visibly recognized uniformly through the substrate, the anode, the hole obstruction layer, the organic material layer, and the electron obstruction layer. As a result, the organic EL element achieves a better display quality in which any pattern does not appear even when the display panel is not driven and only the necessary pattern appear only when the display panel is driven.

What is claimed is:

1. An organic electroluminescent element comprising: a light-permeable anode, an emitting layer of organic materials and a cathode that forms a contiguous layer with the emitting layer and which are layered in turn on a light-permeable substrate, which emits light at a predetermined region upon application of a current between the anode and the cathode, further comprising an electron injection layer being formed so as to occupy partially an interface between the emitting layer and the cathode and having a pattern corresponding to a predetermined region to be displayed, whereby the emitting layer emits light at the occupied interface of the electron injection layer with an application of a voltage across the anode and the cathode.

2. An organic electroluminescent element comprising: a light-permeable anode, an emitting layer of organic materials and a cathode which are layered in turn on a light-permeable substrate, which emits light at a predetermined region upon application of a current between the anode and the cathode, further comprising an electron obstruction layer being formed between the emitting layer and the cathode and having a pattern for restricting emission and a blank pattern corresponding to the predetermined region to be displayed.

3. An organic electroluminescent element comprising: a light-permeable anode, an emitting layer of organic materials that forms a contiguous coating with the anode and a cathode which are layered in turn on a light-permeable substrate, which emits light at a predetermined region upon application of a current between the anode and the cathode, further comprising a hole injection layer being formed so as to occupy partially an interface between the anode and the emitting layer to have a pattern corresponding to a predetermined region to be displayed, whereby the emitting layer emits light at the occupied interface of the hole injection layer with an application of a voltage across the anode and the cathode.

4. An organic electroluminescent element comprising:
   a light-permeable anode, a hole injection layer, an emitting layer of organic materials that forms a contiguous coating with the hole injection layer and a cathode which are layered in turn on a light-permeable substrate, which emits light at a predetermined region upon application of a current between the anode and the cathode, further comprising a hole obstruction layer being formed so as to occupy partially an interface between the anode and the emitting layer and having a pattern for restricting emission and a blank pattern corresponding to a predetermined region to be displayed, whereby the emitting layer emits light at the interface that is not occupied by the hole obstruction layer with an application of a voltage across the anode and the cathode.

* * * * *

UNITED STATES PATENT AND TRADEMARK OFFICE
CERTIFICATE OF CORRECTION

PATENT NO. : 5,949,186
DATED : 9/7/99
INVENTOR(S) : Nagayama et al.

It is certified that error appears in the above-identified patent and that said Letters Patent is hereby corrected as shown below:

On title page, item [54] and col. 1, line 1, title should read
--Organic Electroluminescence Element--

Signed and Sealed this

Twenty-second Day of February, 2000

Attest:

Q. TODD DICKINSON

Attesting Officer       Commissioner of Patents and Trademarks